United States Patent [19]

Hafner et al.

[11] 4,300,272
[45] Nov. 17, 1981

[54] HIGH VACUUM CONTINUOUS CYCLE FABRICATION FACILITY

[75] Inventors: Erich Hafner, Tinton Falls, N.J.; Robert J. Ney, Belleair, Fla.

[73] Assignee: The United States of America as represented by the Secretary of the Army, Washington, D.C.

[21] Appl. No.: 102,093

[22] Filed: Dec. 10, 1979

[51] Int. Cl.³ .............................................. H01L 41/22
[52] U.S. Cl. ..................................... 29/25.35; 228/18; 228/44.1 A; 228/221
[58] Field of Search ............ 29/25.35; 228/18, 44.1 A, 228/221

[56] References Cited

U.S. PATENT DOCUMENTS

| | | | |
|---|---|---|---|
| 3,914,836 | 10/1975 | Hafner et al. | 29/25.35 |
| 3,931,388 | 1/1976 | Hafner et al. | 310/344 |
| 4,028,135 | 6/1977 | Vig et al. | 134/1 |
| 4,125,086 | 11/1978 | Vig et al. | 427/118 |

OTHER PUBLICATIONS

"Quartz Crystal Fabrication Facility", by J. M. Frank et al.; General Electric Publication; Nov. 1977.

Primary Examiner—Carl E. Hall
Attorney, Agent, or Firm—Nathan Edelberg; Jeremiah G. Murray; Michael C. Sachs

[57] ABSTRACT

Disclosed is a semi-automatic processing system for the production of components requiring the deposition of metallization and assembly in an oil free ultra-high vacuum environment. The system is comprised of a plurality of interconnected tubular high vacuum chambers for separately performing ultra-violet cleaning, bake out, plating and sealing of, for example, quartz crystal resonator units, in an in-line configuration adapted for continuous cycle processing of components. The major elements of the system include: (a) a belt type transport which is adapted to convey one or more components through the respective chamber and into an adjoining chamber through an intermediate gate valve; (b) manipulators for handling the component parts inside the vacuum chambers; (c) long life highly directional evaporation sources for evaporated metal deposition on selected component parts; and (d) a sealing apparatus for hermetically sealing the components after evaporation without exposure to atmosphere. Each chamber accordingly is separated from all adjoining chambers by gate valves which make each chamber a self contained modular unit that, for ease of servicing, can be removed and/or inserted into the system without affecting the vacuum integrity of the other chambers.

15 Claims, 21 Drawing Figures

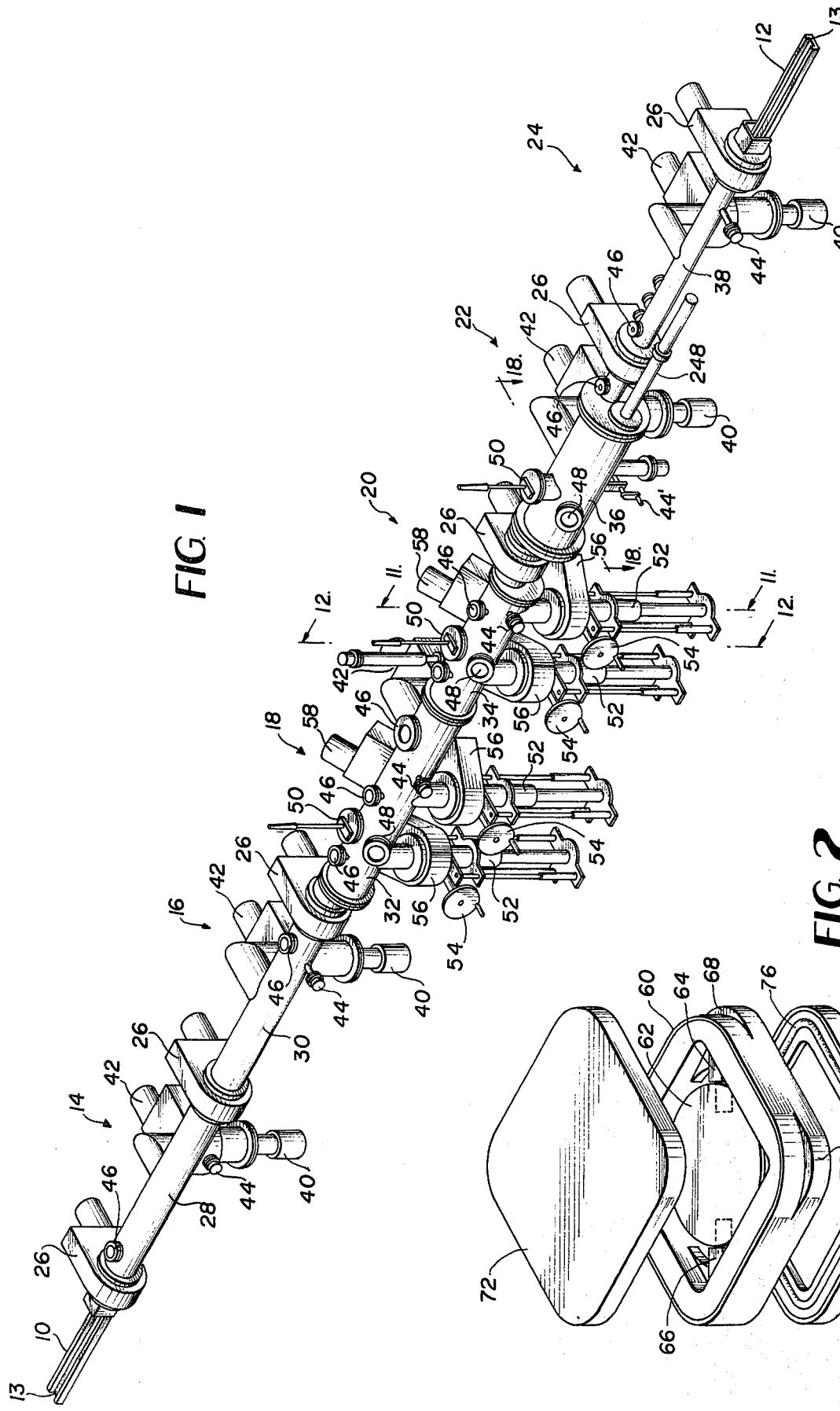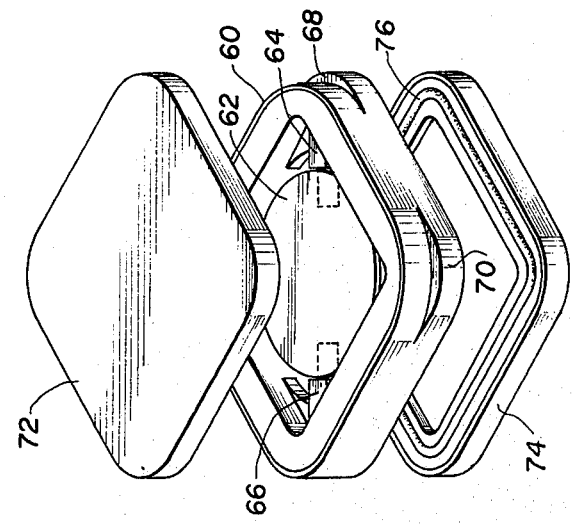

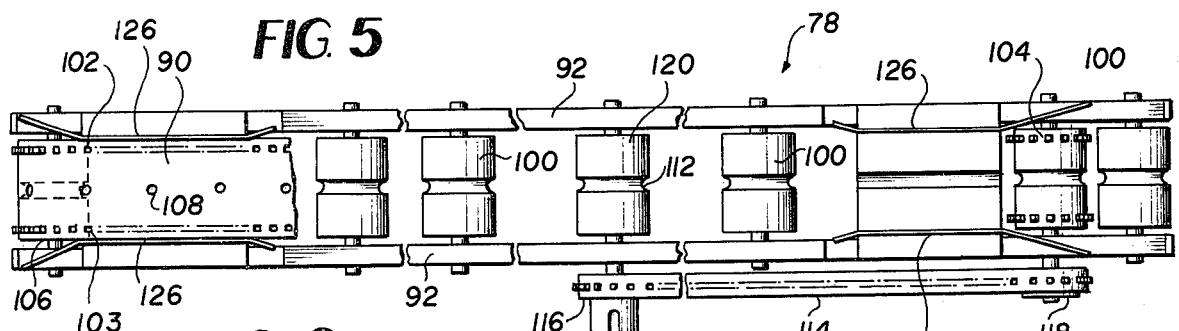
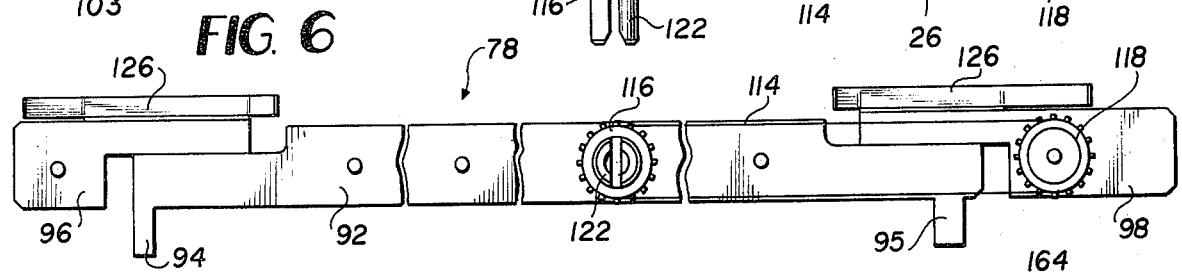
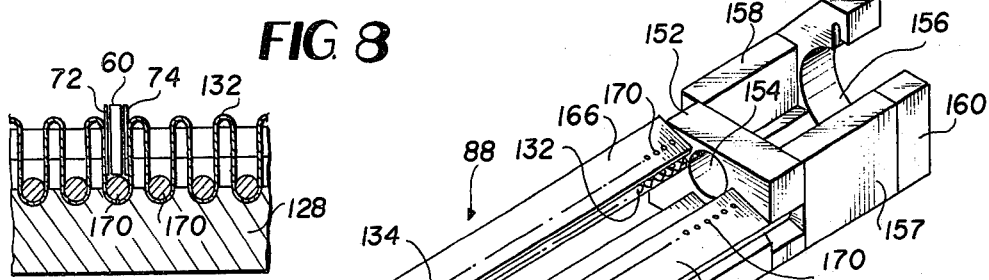
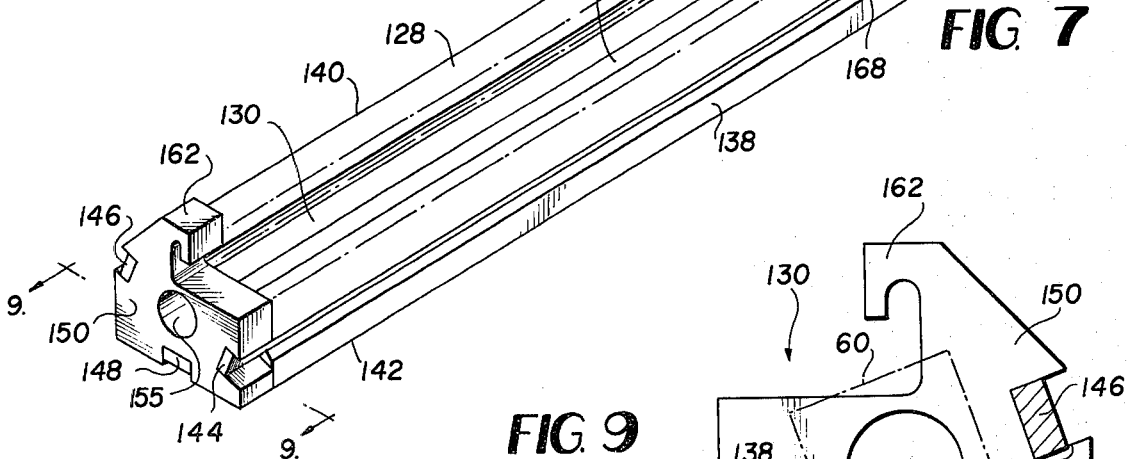
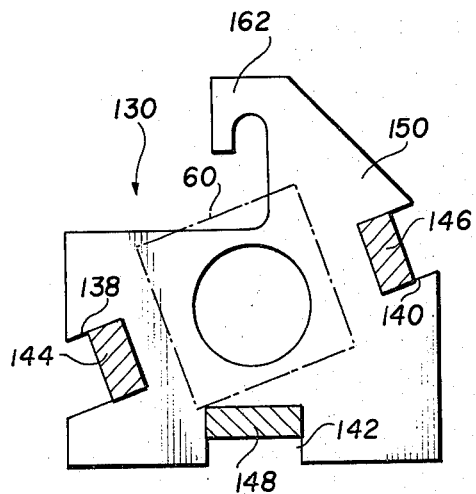
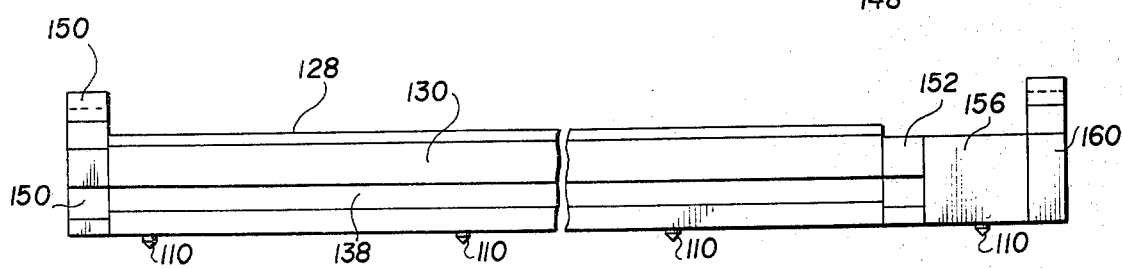

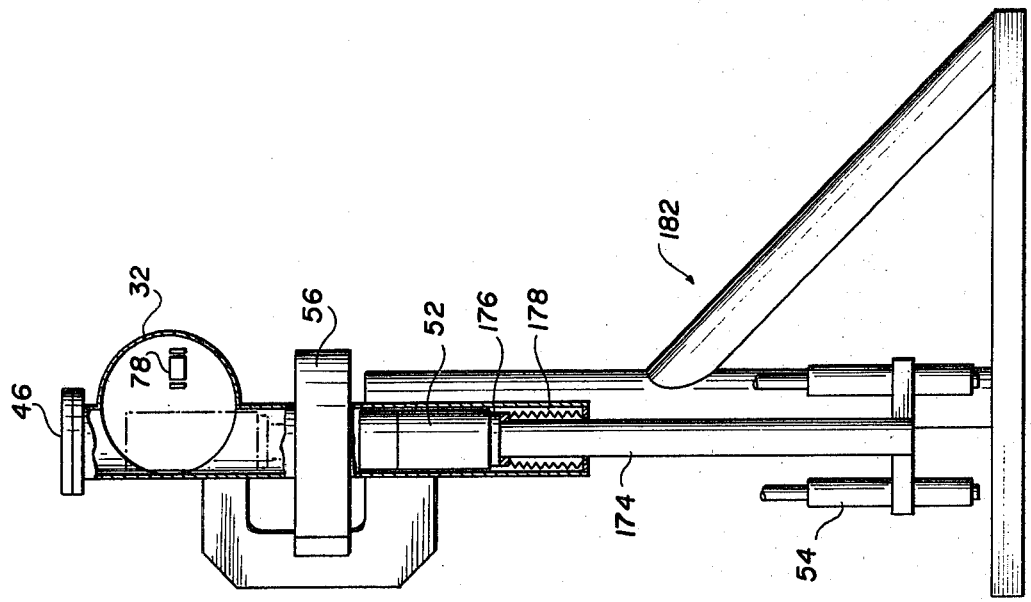
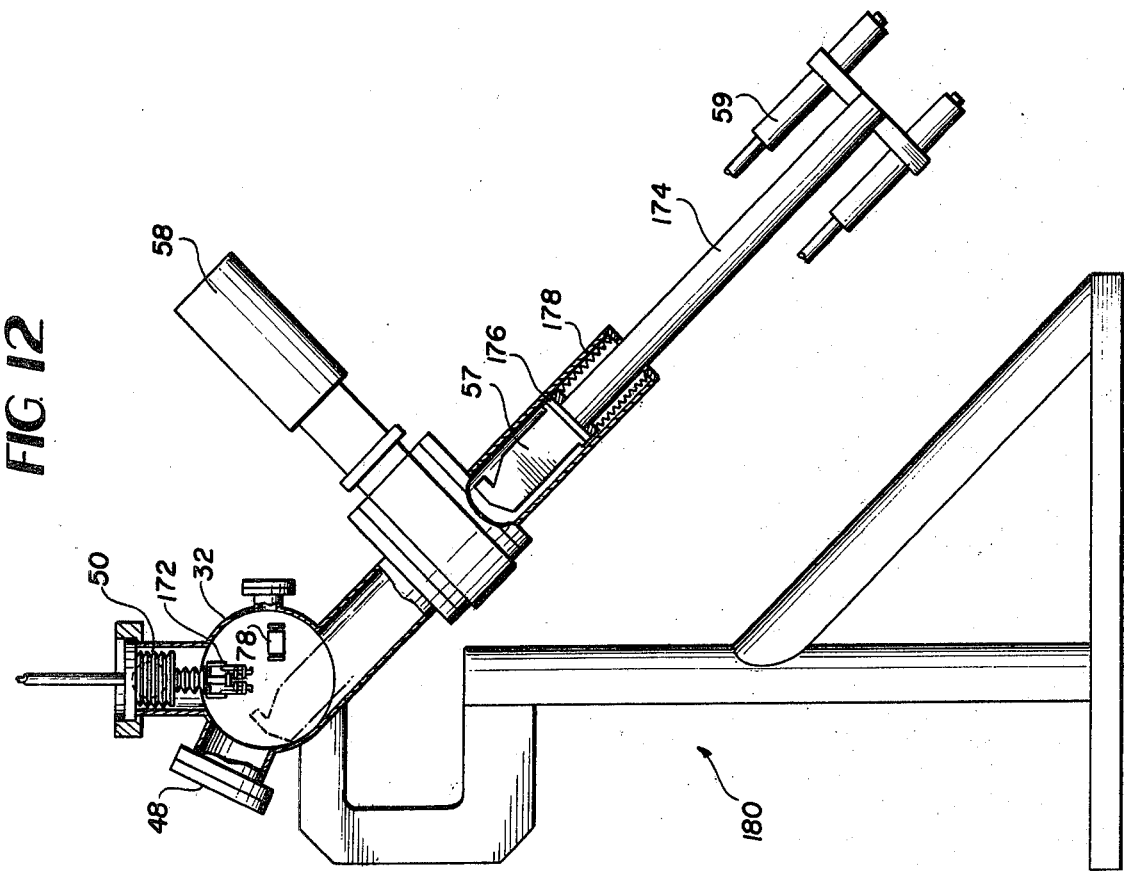

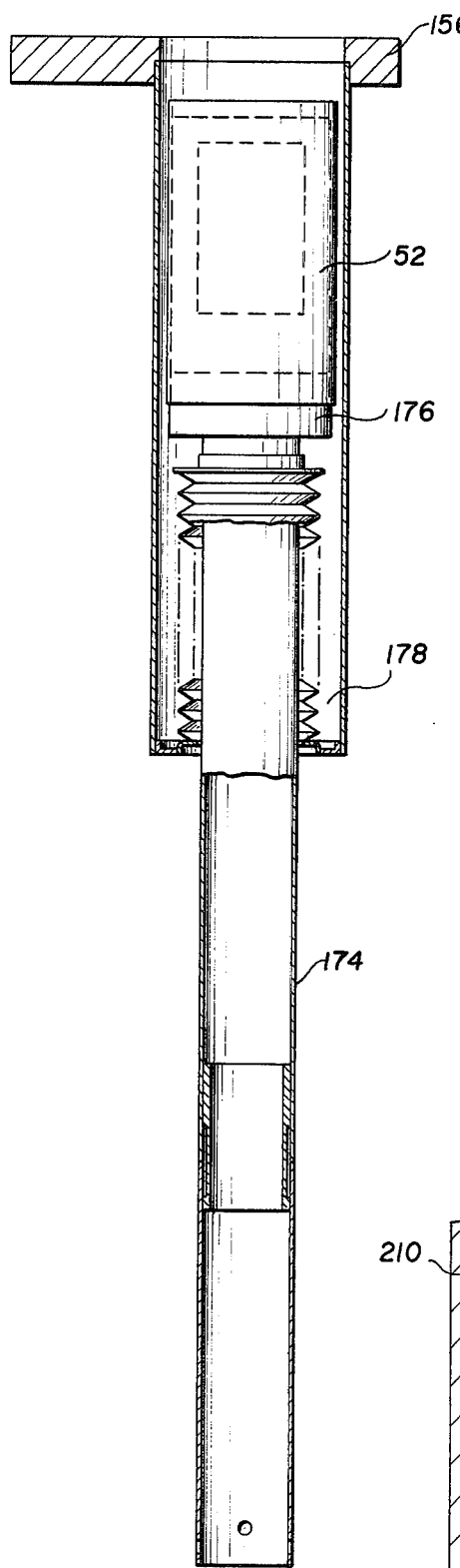
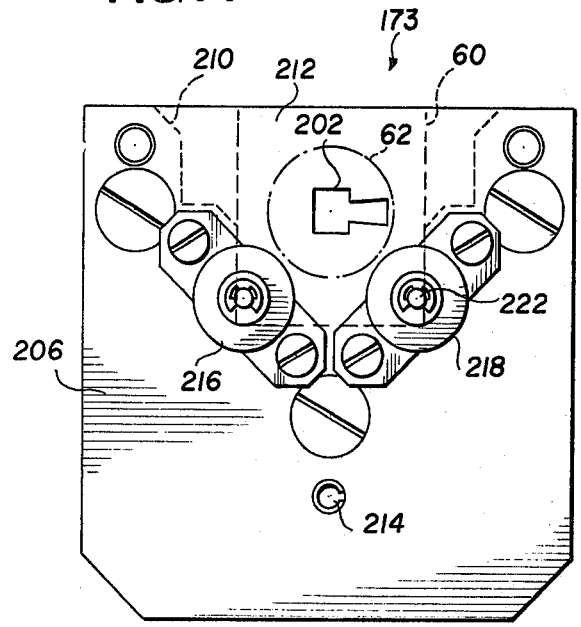
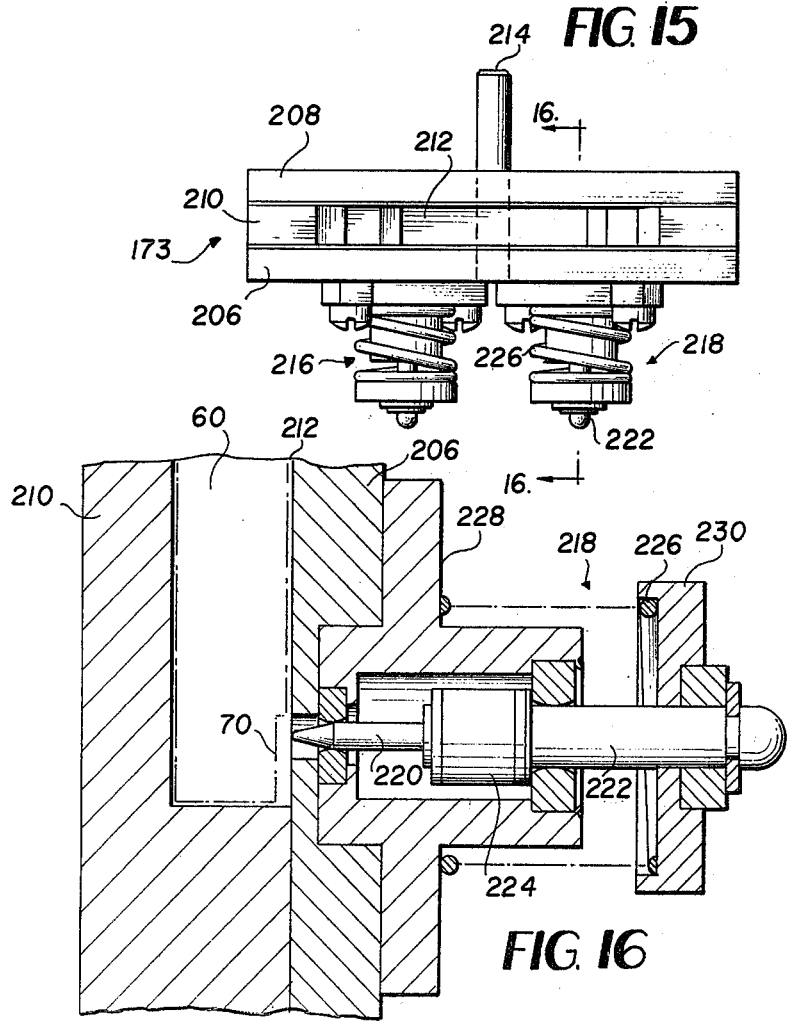
FIG. 14
FIG. 15
FIG. 16
FIG. 17

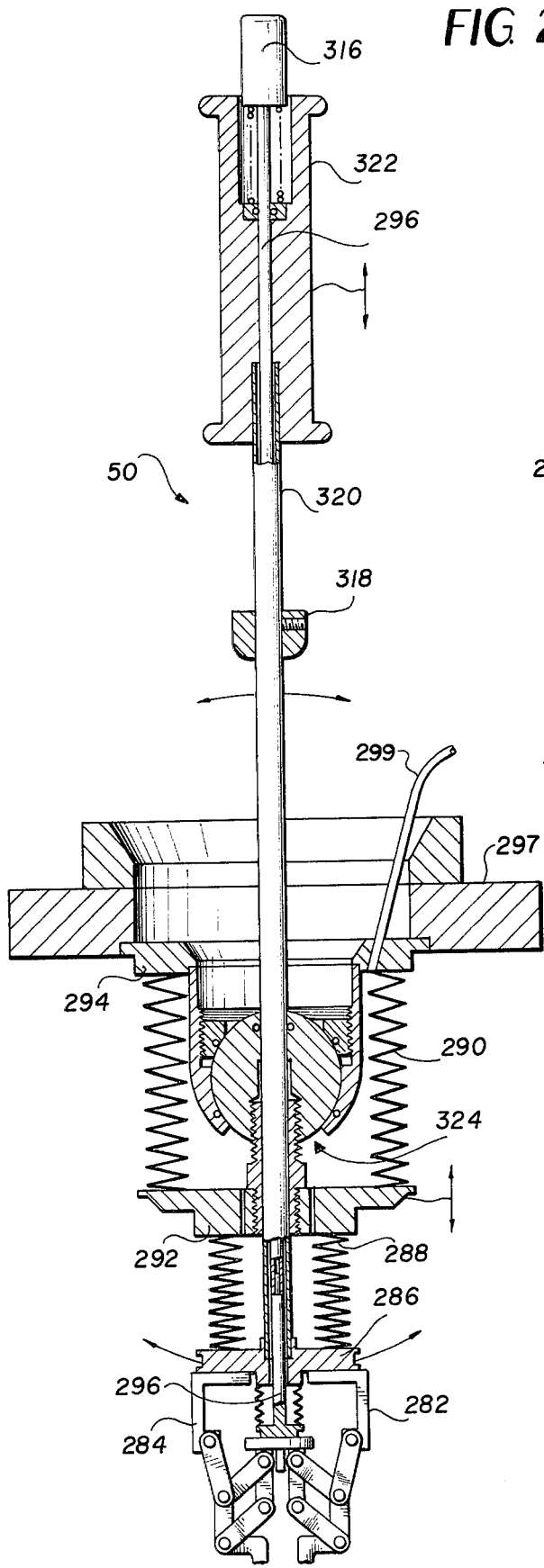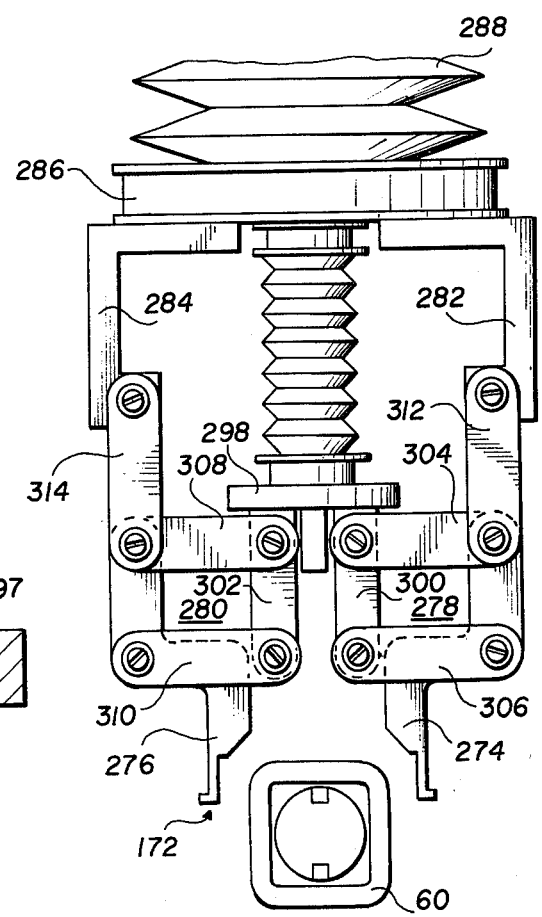

HIGH VACUUM CONTINUOUS CYCLE FABRICATION FACILITY

The invention described herein may be manufactured and used by or for the Government for governmental purposes without the payment of any royalties thereon or therefor.

BACKGROUND OF THE INVENTION

This invention relates to high vacuum apparatus and more particularly to apparatus for processing precision quartz crystal resonators in ceramic flat pack enclosures.

In U.S. Pat. No. 3,914,836 entitled "Method for Processing Quartz Crystal Resonators", Erich Hafner, et al. which issued on Oct. 28, 1975, and assigned to the assignee of the present invention, there is disclosed a plurality of processing steps for fabricating quartz crystal resonators in a high vacuum system, which steps included: cleaning the resonator parts to remove contaminants from the surface, baking the resonator parts at elevated temperatures to further remove adsorbed contaminants, plating electrodes on the crystal resonator and then sealing the parts together. This patent further outlines a high vacuum system for carrying out these processing steps. The present invention, accordingly, is directed but not limited to apparatus embodying such a processing system.

SUMMARY

Briefly, the subject invention is directed to a semiautomatic high vacuum fabrication system, particularly adapted for the processing of quartz crystals, comprising a plurality of interchangeable modular units which are interconnected in an in-line configuration through intermediate gate valves. Gate valves are also located at each end of the system where loading and unloading is effected. Each modular unit is equipped with separate cryogenic high vacuum pump means and a conveyor belt type of transport apparatus whereby components located in a tray can be moved from one fabrication stage to the other without exposure to air. Each modular unit, moreover, includes means whereby the transport can be operated from outside the unit and where appropriate suitable view ports and manipulators are included for carrying out the required sequence of fabrication. Each unit is generally tubular in shape and terminates in flanges which permit uniform assembly. The system is further comprised of: a first high vacuum chamber coupled to said input means and including means for separately cleaning the individual surfaces of said components with ultra-violet light; a second high vacuum chamber coupled to said first chamber and including means for separately heating said components to a predetermined elevated temperature; a third high vacuum chamber coupled to said second chamber and including means for depositing a first layer of metallization on one component of said at least one set of components; a fourth high vacuum chamber coupled to said third chamber and including means for depositing the second layer of metallization on said one component; fifth high vacuum chamber coupled to said fourth chamber and including an offset interior generally cylindrical heating chamber adapted to substantially envelop said tray and having longitudinally extending heater means adapted to contact said tray for heating said set of components and additionally sealing ram means coupled to one end of said heating chamber and sealing said set of components together in a composite unit; a sixth high vacuum chamber coupled to said fifth chamber and including means for acting as an exit chamber; and exit means coupled to said sixth chamber.

DESCRIPTION OF THE DRAWINGS

FIG. 1 is a perspective view generally illustrative of the preferred embodiment of the subject invention;

FIG. 2 is an exploded perspective view of a flat pack quartz crystal resonator package;

FIG. 5 is a top plan view illustrative of the details of a tray transport utilized in each module of the embodiment shown in FIG. 1;

FIG. 6 is a front plan view of the transport subassembly shown in FIG. 5;

FIG. 7 is a perspective view of a component tray which is adapted to be conveyed by the tray transport shown in FIGS. 5 and 6;

FIG. 8 is a partial sectional view of a lateral ribbon spring arrangement contained in the tray shown in FIG. 7 for holding components in place;

FIG. 9 is a transverse cross sectional view of the tray shown in FIG. 7 taken along the lines 9—9;

FIG. 10 is a front plan view of the tray shown in FIG. 7;

FIG. 11 is a sectional view of the embodiment shown in FIG. 1 taken along the lines 11—11 and being generally illustrative of one of the evaporation sources utilized in connection with a plating module;

FIG. 12 is a sectional view of the embodiment shown in FIG. 1 taken along the lines 12—12 and being generally illustrative of a mask and shutter assembly utilized in connection with a plating module;

FIG. 14 is a side plan view of a mask assembly utilized in the mask and shutter assembly shown in FIG. 12;

FIG. 15 is a top plan view of the mask assembly shown in FIG. 14;

FIG. 16 is an enlarged sectional view of the mask assembly shown in FIG. 15 taken along the lines 16—16;

FIG. 17 is a view further illustrative of the evaporation source shown in FIG. 12;

FIG. 20 is a central longitudinal cross sectional view of a manipulator mechanism utilized in conjunction with the subject invention;

FIG. 21 is a fragmentary view of the forceps portion of the manipulator mechanism shown in FIG. 20.

DESCRIPTION OF THE PREFERRED EMBODIMENT

Figure 3:
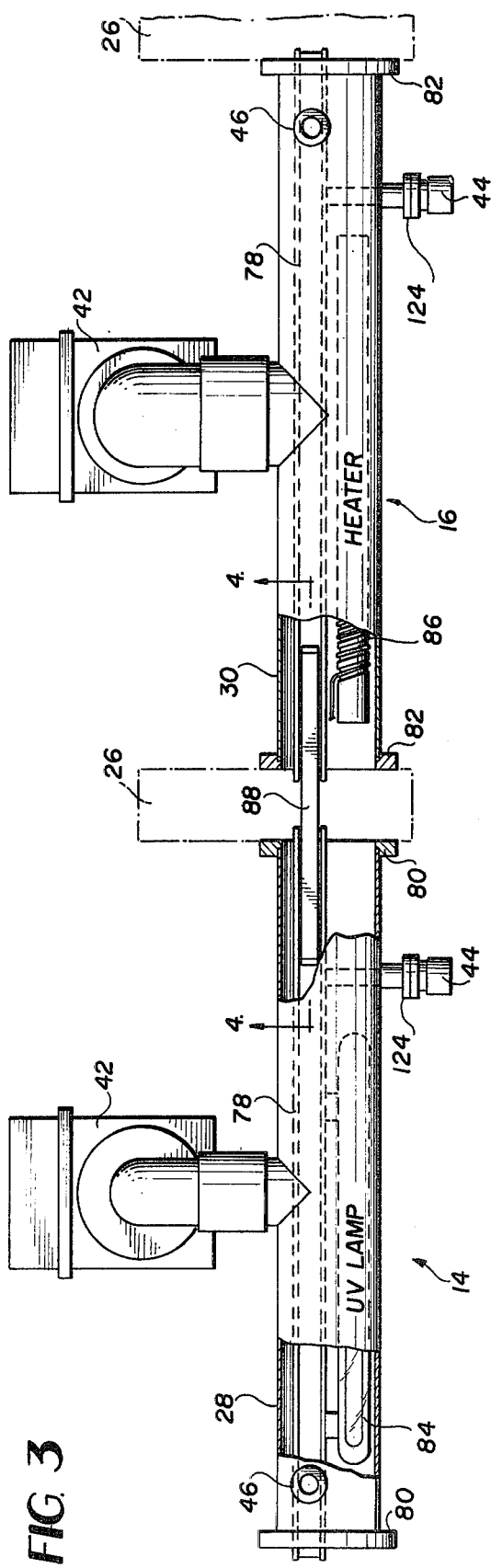
FIG. 3 is a partially cut away top plan view of the first two modules of the embodiment shown in FIG. 1.

Referring now to the drawings, wherein like reference numerals refer to like parts throughout, reference is first made to FIG. 1 which is generally illustrative of the overall combination of an in-line fabrication facility comprised of a plurality of evacuated chambers, each adapted to perform the fabrication step of, for example, processing ceramic flat pack units of the type disclosed in U.S. Pat. No. 3,931,388, entitled, "Crystal Resonator Housing Configurations", which issued on Jan. 6, 1976, in the names of Erich Hafner and John R. Vig. Reference numerals 10 and 12 designate input and output platforms respectively which are in the form of elongated members having lengthwise channels 13 formed therein for accommodating a tray type of component carrier as shown in FIG. 7. The fabrication facility shown in FIG. 1 includes five processing stations 14, 16, 18, 20 and 22 for respectively carrying out the steps of cleaning, baking, coarse and fine plating, and sealing as well as an exit station 24. Sealed gate valves 26 intercouple generally cylindrical chambers 28, 30, 32 and 34, 36 and 38. Each chamber, moreover, is coupled to a separate cryogenic high vacuum pump 40 by means of a respective sealed gate valve 42. Each of the cylindrical chambers include an endless belt transport assembly the details of which are shown in FIGS. 5 and 6. These transport assemblies are adapted to be manually driven or when desired, motor driven by means of externally projecting knobs 44 and a crank 44'. The various cylindrical housings additionally include appropriately placed vertical and angulated view ports 46 and 48 so that an operator is able to view processing steps and where required, manipulate the various components by means of manipulators 50 shown, for example, in FIGS. 20 and 21. The coarse and fine plating stations 18 and 20 as shown in FIG. 1, also include a pair of evaporation source heads 52 which are for ease of servicing, adapted to be inserted into or retracted from the plating chamber by means of respective manually operated elevator assemblies 54 through the gate valve 56. Each of the source heads 52 are adapted to emit a vapor of metallization e.g. gold in a horizontal direction. Such a device is disclosed in U.S. Pat. No. 4,125,086 issued on Nov. 14, 1978 to J. R. Vig, E. Hafner, and R. P. Andres and in U.S. Ser. No. 216,092 entitled, "Nozzle Beam Source", filed on Dec. 15, 1980 in the names of R. J. Ney and E. Hafner. Further details of the evaporation sources 50 and their interrelationship with the cylindrical chambers 32 and 34 via a respective gate valve 56 are shown in FIG. 11. Although not shown in FIG. 1, intermediate each pair of source heads 52, there is located an evaporation mask and shutter assembly which is adapted to be coupled into the cylindrical chambers 32 and 34 by means of a respective sealed gate valve 58. This arrangement is generally shown in FIG. 12 where reference numeral 57 designates a mask and shutter assembly which is, for ease of servicing, adapted to be moved in and out of position by an elevator assembly 59.

The mechanical configuration of the apparatus shown in FIG. 1 is modular and adapted for relatively easy replacement without affecting the vacuum integrity of any of the other stages due to the presence of the gate valves 26. In a like fashion, the various vacuum pumps 40 can be added or removed from the various stages by means of the gate valves 42. Additionally, the source head assemblies 52 as well as the mask and shutter assemblies 57 (FIG. 11) moreover, can be inserted and withdrawn at will through the respective gate valves 56 and 58.

Prior to considering other details of the apparatus shown in FIG. 1, reference will now be made briefly to FIG. 2 where there is illustrated the component parts of a flat pack ceramic resonator package which is to be assembled by the utilization of the subject invention. The package shown in FIG. 2 includes a generally rectangular shaped ceramic "picture" frame 60 which is adapted to hold a circular crystal resonator element 62. The crystal element is held in place by means of a pair of metal clips 64 and 66 which are adapted to contact respective areas of metallization, not shown, which extends to exterior shoulder regions 68 and 70 which also include metallization so that electrical interconnection can be made for external energization of the resonator element in a well known fashion. Top and bottom flat ceramic covers 72 and 74 are adapted to be placed in contact with the rims of the frame 60 and sealed thereto by means of a thin gasket of metallization 76 e.g. gold, which encircles the inner face of each lid. These components are placed on edge in a cover-frame-cover relationship in the tray shown in FIG. 7 and passed through the individual processing stations shown in FIG. 1.

Movement of the tray from station to station occurs along a common transport center line and is disclosed partially in FIG. 3. There reference numeral 78 designates like transport assemblies which are shown in detail in FIGS. 5 and 6 and which are mutually aligned and extend beyond the terminal flanges 80 and 82 of the tubular chambers 28 and 30 such that they extend into the region of the intermediate gate valve 26 on either side of the closure means, not shown. The two transport assemblies 78 while being in line are situated off to the side of the central longitudinal axis of the tubular chambers 28 and 30 so that an ultra violet lamp assembly 84 and a heater assembly 86 can be located therein so that the first station 14 includes apparatus for cleaning the component surfaces by irradiation of ultra violet light followed by a heating and baking of the components in the second station 16.

Figure 4:
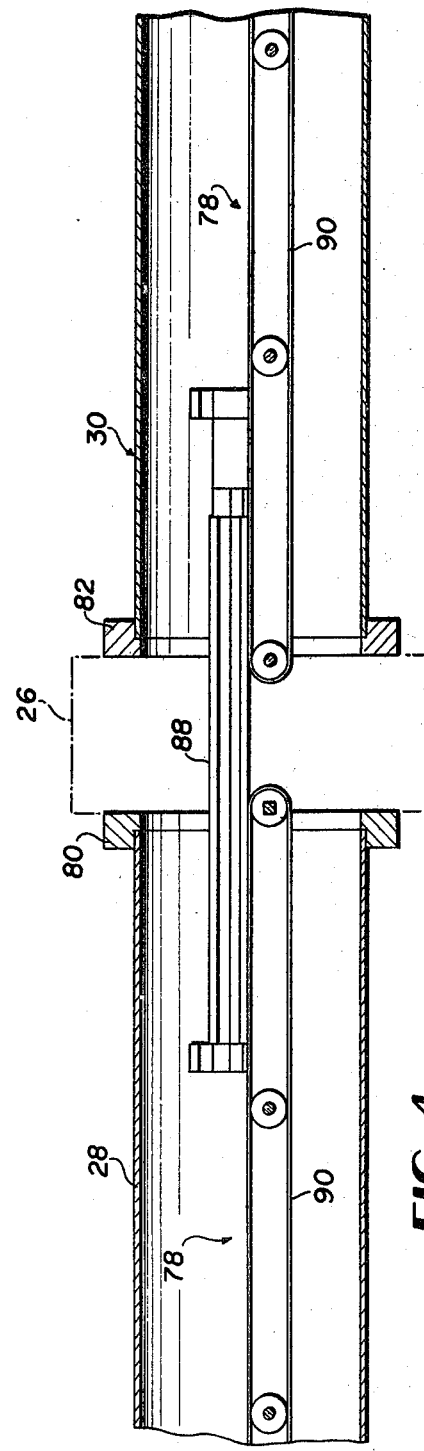
FIG. 4 is a sectional view of the apparatus shown in FIG. 3 taken along the lines 4—4.
Figure 19:
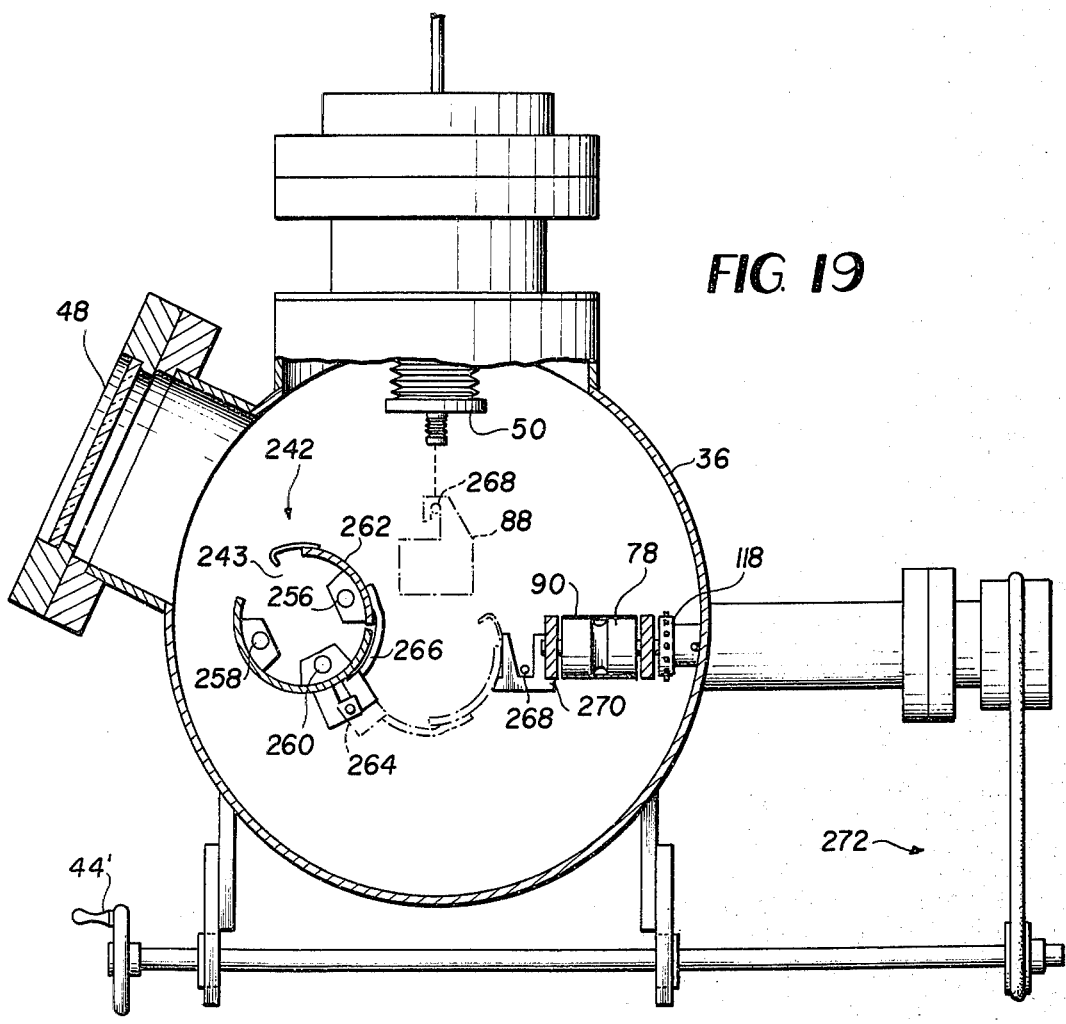
FIG. 19 is a cross sectional view of the chamber shown in FIG. 18 taken along the line 19—19.

FIG. 3 and particularly FIG. 4 is intended to illustrate the manner that a component transport tray assembly 88, the details of which are shown in FIGS. 7 through 10, is adapted to span the extremities of two adjoining transport assemblies 78. Thus a tray 88 when in the facility shown in FIG. 1, is moved from one processing station to the other by means of the activation of the appropriate transport assembly by means of the knob 44 or crank 44' (FIG. 19). Referring now collectively to FIGS. 5 and 6, there is shown the mechanical details of six identical transport assemblies which are contained in each of the six tubular chambers 28, 30 . . . 38 of FIG. 1. Each transport assembly 78 includes an elongated stainless steel frame 92 having a pair of support legs 94 and 95 located at each end. Frame extensions 96 and 98 are secured to the upper portion of the frame 92 and extend outwardly from the end thereof so as to project into the gate valve region such as shown in FIGS. 3 and 4. The main frame 92 as well as the frame extensions 96 and 98 are adapted to serve as a mounting for a plurality of rotatable roller members 100 over which a stainless steel endless belt 90 is adapted to move and be supported thereby. The belt 90 consists of a relatively thin flexible stainless steel strip having two sets of closely spaced sprocket holes 102 and 103 located on its outer edge so as to engage the teeth of sprocket rollers 104 and 106 at either end of the assembly. In addition to the sprocket holes 102 and 103, the belt 90 also includes centrally located holes 108 which are adapted to engage projections 110 on the underside of the tray 88 as shown in FIG. 10. It should also be noted that the roller members 100 as well as sprocket rollers 104 and 106 also include peripheral grooves 112 which are in registration with the holes 108 of the belt 90 so that the projections 110 of the tray do not contact the rollers. Movement of the belt 90 is caused by means of a small relatively narrow drive belt 114 extending between a pair of sprockets 116 and 118 coupled to the roller members 120 and 104. The sprocket 116 additionally includes a keyed shaft member 122 which is adapted to engage the operator knob 44 by means of a magnetically coupled feedthrough mechanism 124 (FIG. 3). It should also be noted that both sides of the belts 90 and 114 are coated with molybdenum disulfide which acts as lubricant material in the vacuum environment within which the apparatus is intended to operate in a clean, flawless manner. Additionally, the transport assembly 78 also includes a pair of guide rails 126 having flared end portions to properly position and guide a component tray 88 with respect to the transport belt 90 as it is being fed onto and off the belt 90.

Figure 18:
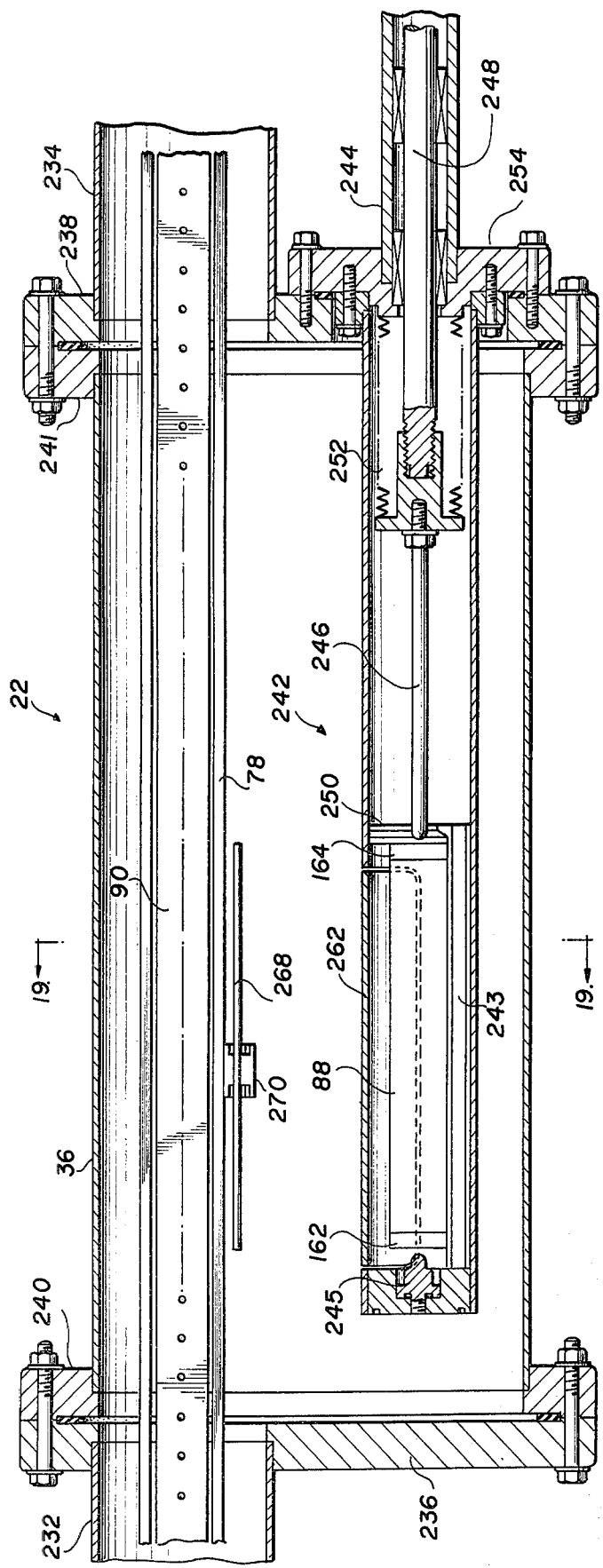
FIG. 18 is a longitudinal cross sectional view of a heating and sealing chamber utilized in the embodiment shown in FIG. 1.

Directing attention now to the configuration of the transport tray 88, reference is made to FIGS. 7 through 10. The tray includes an elongated body 128 having a longitudinal opening 130 therein which is adapted to accept and hold plural sets of components (FIG. 2) that are maintained on edge in a vertical attitude and spaced mutually parallel by a lateral ribbon spring assembly 132 as shown in FIG. 8. The interior portion of the tray includes a shoulder element 134 which is adapted to provide an abutment for the components and outwardly tilt them as shown by the phantom lines in FIG. 9 and thus render them more easily accessible to the manipulator mechanisms 50 utilized in the two plating stations stages 18 and 20 (FIG. 1) where the frames 60 are removed from the tray during plating and then returned. The tray body 128 furthermore includes three elongated channels on the front, rear and bottom faces 138, 140 and 142 which are adapted to accommodate elongated heater bars 144, 146 and 148, respectively which terminate in end pieces 150 and 152. The heater bars 144, 146 and 148 are adapted to act as heat sinks for respective heater elements coming in contact therewith during the sealing process as will be explained subsequently when FIGS. 18 and 19 are considered. The end pieces 150 and 152, moreover, includes central openings 154 and 155 which are circular in configuration. The opening 154 is adapted to receive a sealing ram, not shown, while opening 155 is adapted to receive a reaction ram in a heating and sealing tube. An end passage 156 through which the sealing ram passes is formed by the elements 157, 158 and an end piece 160. It is to be noted that the end pieces 150 and 160, moveover, include upper hook like extensions 162 and 164 and form open slots which permit the entire tray 88 to be removed from transport 78 in the heating and sealing station 22.

As mentioned above, the components that are loaded in the transport tray 88 are held in position by means of lateral ribbon springs such as shown in FIG. 8. FIG. 7 further illustrates the inclusion of two opposing top walls 166 and 168 which include a plurality of pins 170 spaced at equal intervals along the walls 166 and 168 with the respective ribbon spring elements 128 wound around the pins. Accordingly, opposing pairs of spring elements are provided within which the components are positioned and held in place thereby. Accordingly, flat pack resonator components such as shown in FIG. 2 can be placed in multiple sets in the transport tray 88 for conveyance from one processing station to another within the facility shown in FIG. 1 by means of the respective transports shown in FIGS. 5 and 6.

As noted with respect to FIG. 3, the first two processing stations 14 and 16 respectively deal with means for separately cleaning and baking the crystal resonator components which have been loaded into a transport tray and conveyed through the cylindrical chambers 28 and 30 after passing through a gate valve 26 as shown in FIG. 3. Considering now the processing stages 18 and 20 which comprise coarse and fine plating stages, respectively, each "picture" frame member 60 (FIG. 2) containing a crystal resonator element 62 which has been loaded in the tray 88 is removed from the tray, positioned in a plating mask wherein gold is evaporated in a predetermined pattern onto both sides of the resonator crystal 62 to establish an operating frequency. Following each plating sequence the frame is returned to its position in the tray. FIGS. 11 and 12 are now referred to and are intended to illustrate the details of the coarse plating apparatus. Inasmuch as the fine plating apparatus is essentially a duplication of the apparatus utilized in the first stage, only one will be considered.

FIGS. 11 and 12 have been briefly referred to above when FIG. 1 was considered. What these two figures are additionally intended to illustrate is the relationship of the transport 78 with respect to the source heads 52 and mask and shutter assembly 57. Both of these elements are adapted to be inserted into the evacuated chamber 32 adjacent the transport assembly 78 via respective gate valves 56 and 58. A view port 48 is located thereat and a manipulator mechanism 50 having a pair of externally movable forceps 172 is adapted to grasp a frame 60 from a tray 88, not shown, and position to within a plating mask sub-assembly 173, the details of which are shown in FIGS. 14 through 16, located within the assembly 57. Meanwhile, on either side of the mask and shutter assembly 57 is positioned an evaporation source head 52 as shown in FIG. 12 wherein the source head is elevated into position within the chamber 32 under the view port 46. In each case, the elevator assembly 54 additionally includes a push rod 174 which couples to a mating flange 176 through an intermediate bellows arrangement 178. The structural arrangements shown in FIGS. 11 and 12 additionally disclose mounting structures 180 and 182 which are commonly referred to as stands and which are included with each of the modular sections to position the apparatus above a base structure, not shown.

Figure 13:
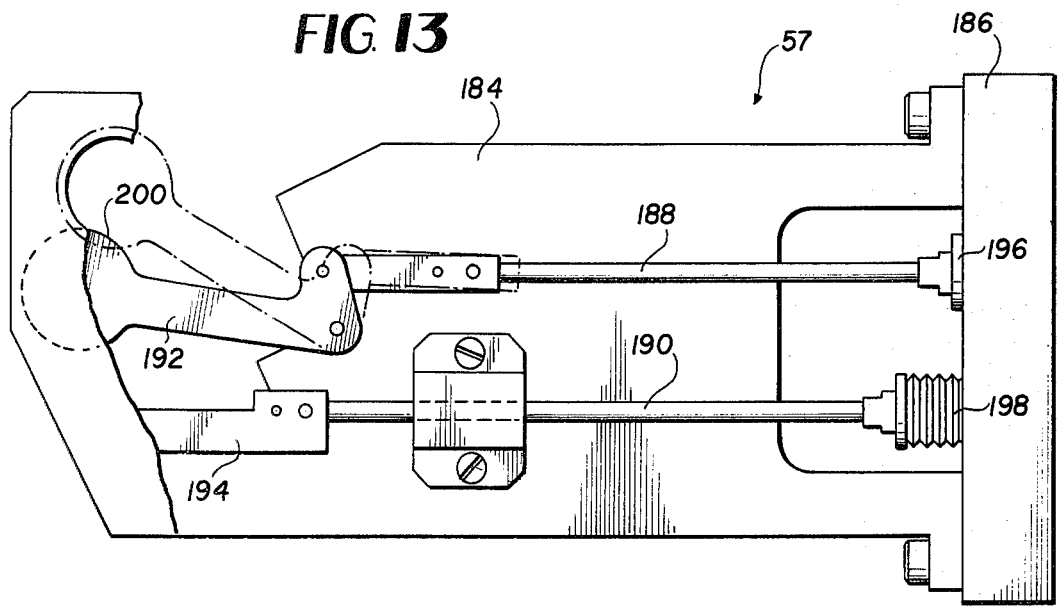
FIG. 13 is a side plan view illustrative of the details of the shutter mechanism for the mask and shutter assembly shown in FIG. 11.

Referring now to the mask and shutter assembly 57 shown in FIG. 12, FIGS. 13 through 16 are now considered. FIG. 13 is intended to illustrate a shutter and holder sub-assembly 184 which is adapted to accommodate an evaporation mask sub-assembly 173 whose details are shown in FIGS. 14, 15 and 16. The sub-assembly 184 includes a rear flange member 186 which is adapted to engage the flange 176 shown in FIG. 11. Emerging from the flange 176 is a pair of push rods 188 and 190 which are adapted to operate a shutter member 192 and a movable electrical connector element 194. In both instances, push rods 188 and 190 are adapted to be moved by external operators coupled thereto via bellows members 196 and 198.

Referring now to FIGS. 14 and 15, there is shown the details of the evaporation mask sub-assembly 173 which is to be located in the forward portion of the shutter sub-assembly 184 shown in FIG. 13 so that the circular shutter portion 200 is adapted to move in and out of registration with the circular area surrounding a metallization aperture 202. Thus when the shutter 192 as shown in FIG. 13 is energized, the aperture 202 is covered, while in the position shown in FIG. 13 the aperture is adapted to be exposed to metallization e.g. gold emanating from the adjacent source head 52. The mask sub-assembly 173 is comprised of two generally flat aperture members 206, 208 and an intermediate member 210. The intermediate member 210 has an upper contour as shown by the dotted line in FIG. 14 and is thus adapted to provide a receptacle region 212 for receiving a resonator frame 60 which has been transferred thereto from the transport tray 88 via the manipulator forceps 172 shown in FIG. 11. Accordingly, the front and rear members 206 and 208 both have evaporation apertures 204 as shown in FIG. 14 so that both sides of the crystal are plated. The mask sub-assembly 173 additionally includes a dowel pin 214 to hold the three members 206, 208 and 210 together. Additionally, in order that a crystal element 62 (FIG. 2) located within the frame 60 can be energized during the evaporation process, a pair of spring biased electrical contacts 216 and 218 are mounted on the face of the member 206 with suitable apertures therethrough for making contact with the metallization areas 68 and 70 shown of the frame 60. The contacts 216 and 218 are identical in mechanical detail and is shown, for example, in the sectional view of FIG. 16. Each electrical contact is comprised of an inner and outer contact pin 220 and 222 interconnected by means of a chip capacitor 224. The inner end of the pin 220 is terminated in a point for contact with the frame 60, whereas the outer end of the pin contact 222 is blunted for contact with the electrical connector 194. The combination of the two contacts and the coupling capacitor is movable, however, it is outwardly biased by means of a spring 226 which is positioned between the shoulder 228 and plate member 230. Thus when push rod 190 and connector 194 is urged against contacts 216 and 218, the crystal 62 will be energized in a well known manner. Mask assemblies adapted to different size frames 60 are interchangeable by use of the manipulator without opening the plating chambers to atmosphere.

Following the coarse and fine plating, the frame 60 is returned to its designation position in the tray 88 where it is then moved to the heating and sealing station 22, the details of which are shown in FIGS. 18 and 19. Referring first to FIG. 18, the sealing process takes place in the main chamber 36. Intermediate the gate valves 26 shown in FIG. 1 at each end of the chamber 36, short tubular extensions 232 and 234 are joined to 36 and are coupled thereto by means of respective flanges 236 and 238 coupled to flanges 240 and 241.

The purpose of the chamber 36 is to accommodate a heater tube and ram assembly 242 including a cylindrical heater tube chamber 243 which is adapted to receive a transport tray 88 which is transferred thereto from the transport mechanism 78. An externally actuable ram assembly 244 having an elongated ram member 246 is coupled to the inner end of a driver 248 and which is adapted to enter the end 250 of the heater tube chamber 243 and protrude through the circular openings 154 and 156 of the tray 88 shown in FIG. 7. When the ram is actuated, the covers 72 and 74 (FIG. 2) are compressed against an intermediate frame 60 through the action of a reaction ram 245 and the components are then sealed together under the simultaneous action of pressure and heat. The driver 248 is coupled to the ram member 246 through a metal bellows 252 in order to provide a longitudinal movement of the ram assembly while preserving the integrity of the vacuum environment within the processing chamber 36. A mechanical coupling of the ram assembly 242 is made to the flange 241 by means of the flange member 254 which is suitably bolted to the flange 241 adjacent the tubular extension 234.

In order to provide the necessary heat whereby the gold gasket 76 shown in FIG. 2 and associated with the inner face of both ceramic covers 72 and 74 are bonded to frame 60, the heater tube 242 includes three elongated heater elements 256, 258, and 260 which are shown on end in FIG. 19 and which are adapted to contact the heater bars 144, 146 and 148 of the component tray 88 when positioned therein. The necessary electrical connections are accommodated through appropriate feedthroughs, not shown, in the flange 254.

In order to facilitate the transfer of the tray 88 from the transport mechanism 78 to the heat chamber 243, the chamber itself includes an upper portion 262 which is coupled to a hinge 264 by means of a cam 266 whereby the interior of the heat chamber can be exposed to the manipulator mechanism 50. The portion 262 thus acts as a door which is adapted to be laid back in an open position towards the transport mechanism 78 as shown in FIG. 19. Transfer of the component tray 88 from the transport 78 to the heater chamber 243 is accomplished by means of an elongated bar member 268 which is adapted to span the end pieces 150 and 160 of the tray 88 as shown in FIG. 7 and engage the open slots in the upper portions 162 and 164. The manipulator 50 thus is adapted to grasp the bar 268 and make the required transfer. When the bar 268 is not in use, it is placed on a support member 270 attached to the side of the transport 78 adjacent the heater tube 242 as shown in FIG. 18. Alternatively the bar 268 is permanently secured to the manipulator 50.

Thus the resonator components which have previously been cleaned, baked and suitably plated are sealed in the heater chamber 243. Following this step, the component tray 88 is returned to the transport 78 where by means of the handle 44' and the mechanical coupling assembly 272 running to the rear portion of the tubular chamber 36 as shown in FIG. 19 the sprocket 118 is turned and the tray moved into the exit chamber 38 as shown in FIG. 1 through the gate valve 26 where it is then moved to the system exterior through the final gate valve where it is removed from the platform 12.

The manipulator apparatus 50 generally referred to in the foregoing detailed description is shown in detail in FIGS. 20 and 21. Structurally, the manipulator 50 includes the hinged forceps assembly 172 which includes a pair of gripper elements 274 and 276 which are pivotally attached to respective parallel linkages 278 and 280 coupled to the mounting brackets 282 and 284. These brackets are attached to a ring 286 secured to the lower end of a first mechanical bellows 288 which is connected to a second larger bellows 290 through a mechanical coupling 292. The bellows 290 terminates at its upper end in a ring member 294 which is secured to a base 297 which is adapted to be mounted on the outer surface of a circular chamber. The gripper elements 274 and 276 are adapted to be moved linearly between open and closed positions by means of an actuating rod 296 which terminates in a pivot bracket 298 to which a pair of drive links 300 and 302 are attached. Two pairs of parallel links 304, 306 and 308 and 310 have one end coupled to the drive links 300 and 302 while their opposite ends connect to swing links 312 and 314 and the gripper elements 274 and 276 respectively. Downward movement of the rod 296 causes downward movement of the drive links 300 and 302. Accordingly, the two pairs of parallel links 304, 306, 308 and 310 move downwardly together causing the links 312 and 314 to swing outwardly while the gripper elements move away from one another in a linear motion. A small tube-like element 299 is provided for facilitating the evacuation of the chamber within the confines of the bellows to permit the manipulators to be operated by hand.

The upper end of the rod 296 is coupled to a spring biased downwardly depressible button type member 316, whose downward movement will force the forceps apart. The entire assembly as shown in FIG. 20 is adapted to be raised and lowered to the stop 318 by means of an outer tubular rod 320 through which the actuator rod 296 extends. Vertical movement of the manipulator 50 is effected through the grasping of a handle member 322 which is also adapted to contain the forceps actuator button 316. In addition to the vertical movement inside of a chamber, the manipulator assembly 50 is adapted to be swiveled through a ball and socket configuration 324 located within the bellows 290. The gripper elements 274 and 276 are particularly adapted for grasping a ceramic frame 60. These elements however can, when desired, be modified in a manner to accomplish a specific task. For example, in the sealing stage 22, the elements 274 and 276 may be modified to more easily grasp the rod 268 for lifting a component tray 88 to and from the transport apparatus 78. Also in the sealing stage 22 the gripper elements can be deleted entirely with the actuator rod 296 being permanently attached to the lifting rod 268.

Thus what has been shown and described is an improvement in a facility for processing quartz crystal units involving ultra-violet cleaning, bake out, plating and sealing of crystal units in an oil free cryogenic vacuum environment. While the foregoing disclosure has been made with a certain degree of particularity, the same has been made by way of explanation and not of limitation. Accordingly, all modifications, alterations and substitutions coming within the spirit and scope of the present invention are herein meant to be included.

We claim as our invention:

1. In a high vacuum fabrication facility including a plurality of intercoupled in-line replaceable modular processing chambers for cleaning, baking, plating and sealing components into packaged units, said chambers including means for being individually evacuated irrespective of the vacuum state of any other of said chambers and including transport means within each chamber for conveying a tray containing at least one set of components, said tray being conveyed along a common center line through said facility, the improvement comprising in combination:
   input means;
   a first high vacuum chamber coupled to said input means and including means for separately cleaning the individual surfaces of said components with ultra-violet light;
   a second high vacuum chamber coupled to said first chamber and including means for separately heating said components to a predetermined elevated temperature;
   a third high vacuum chamber coupled to said second chamber and including means for depositing a first layer of metallization on one component of said at least one set of components;
   a fourth high vacuum chamber coupled to said third chamber and including means for depositing the second layer of metallization on said one component;
   fifth high vacuum chamber coupled to said fourth chamber and including an offset interior generally cylindrical heating chamber adapted to substantially envelop said tray and having longitudinally extending heater means adapted to contact said tray for heating said set of components and additionally sealing ram means coupled to one end of said heating chamber and sealing said set of components together in a composite unit;
   a sixth high vacuum chamber coupled to said fifth chamber and including means for acting as an exit chamber; and
   exit means coupled to said sixth chamber.

2. The fabrication facility as defined by claim 1 wherein said set of components comprise at least one set of flat pack resonator components including a crystal element.

3. The facility as defined by claim 2 wherein said heating and sealing means in said fifth chamber comprises an offset interior generally cylindrical heating chamber adapted to substantially envelop said tray and having longitudinally extending heater means adapted to contact and apply heat to said tray, and
   sealing ram means coupled to one end of said offset heating chamber.

4. The facility as defined by claim 3 wherein said longitudinally extending heater means comprises a plurality of elongated heater elements mounted in substantially mutual parallel relationship within the confines of said offset heating chamber.

5. The facility as defined by claim 4 wherein said tray includes an elongated body portion having a plurality of contact bar members mounted thereon and being adapted to respectively contact said plurality of heater elements when positioned in said offset heater chamber.

6. The facility as defined by claim 5 wherein said tray includes a longitudinal support member in said body for outwardly angulating said at least one set of resonator components to facilitate insertion and removal thereof during the conveyance of said tray through said facility.

7. The facility as defined by claim 5 wherein said tray includes end pieces attached to opposite ends of said body, said end pieces including upwardly extending end portions adapted to engage a gripped bar member which is adapted to lift and lower said tray to and from said transport means and said offset heating chamber, and
   additionally including a bar member located within said fifth chamber and a manipulator mechanism mounted on said fifth chamber and being operable to grip said bar member for moving said tray.

8. The facility as defined by claim 3 wherein said offset heating chamber includes a cylindrical body having a portion thereof pivotally hinged on an edge to provide a door for facilitating the entrance and egress of said tray.

9. The facility as defined by claim 8 wherein said offset heating chamber includes a reaction ram member located at one end thereof within the chamber along the central longitudinal axis thereof, an opening at the other end thereof along said central longitudinal axis for permitting the passage of a compression ram therethrough, and additionally including a compression ram assembly secured to said fifth chamber and having an elongated rod type of compression ram adapted to move along said central longitudinal axis of said heating chamber.

10. The facility as defined by claim 2 wherein said means for depositing said first and second layers of metallization includes a mask and shutter assembly located between opposing sources of vapor deposition, said assembly including a deposition mask sub-assembly adapted to orient said crystal element for the deposition of metallization defining a pair of electrodes on opposite faces of said crystal element, and a controllable shutter sub-assembly supporting said mask sub-assembly and having a pair of movable shutters operable to rotate in and out of registration with said crystal element for providing a barrier between said opposing sources of vapor deposition and said crystal element.

11. The facility as defined by claim 2 wherein said third, fourth and fifth chamber additionally includes manipulator mechanisms for selectively moving components or a tray of components to and from said transport means, said manipulator mechanisms included in said third and fourth chambers, at least, being configured to include an assembly of two gripper elements coupled to a linkage configuration which is operable to move said gripper elements in a mutually linear motion to and from open and closed positions to grasp one of said components.

12. The facility as defined by claim 11 wherein said manipulator mechanisms in said third and fourth chambers include an actuator rod and a pivot bracket, and wherein said linkage configuration is coupled between said actuator rod and said pivot bracket and includes a pair of fixed drive links coupled to said actuator rod, a pair of pivoted links coupled to said pivot bracket, and two pairs of mutually parallel links first like links of said two pair of links having one end respectively coupled to said drive links and the other end respectively coupled to said pivoted links, and second like links of said two pair of links having one end respectively coupled to said drive links and the other end respectively coupled to said gripper elements.

13. The facility as defined by claim 12 wherein said manipulator mechanism included in said fifth chamber includes a bar member and an actuator rod coupled to said bar member, said bar member being adapted to lift said tray off of said transport means and convey said tray to said heating chamber.

14. The facility as defined by claim 13 wherein said manipulator mechanism in said fifth chamber includes a pair of gripper elements coupled to and operated by said last recited actuator rod, said gripper elements being adapted to grasp said bar member.

15. The facility as defined by claim 13 wherein said last recited actuator rod is fixedly coupled to said bar member.

* * * * *